(12) United States Patent
Moon et al.

(10) Patent No.: US 8,314,036 B2
(45) Date of Patent: Nov. 20, 2012

(54) METHODS OF FORMING FINE PATTERNS OF SEMICONDUCTOR DEVICE

(75) Inventors: Seongho Moon, Yongin-si (KR); Yool Kang, Yongin-si (KR); HyoungHee Kim, Hwaseong-si (KR); Seokhwan Oh, Seoul (KR); So-Ra Han, Bucheon-si (KR); Seongwoon Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 254 days.

(21) Appl. No.: 12/794,890

(22) Filed: Jun. 7, 2010

(65) Prior Publication Data

US 2011/0027993 A1    Feb. 3, 2011

(30) Foreign Application Priority Data

Jul. 28, 2009  (KR) .................. 10-2009-0068978

(51) Int. Cl.
*H01L 21/302* (2006.01)

(52) U.S. Cl. ........ 438/736; 438/717; 438/737; 438/745; 216/46

(58) Field of Classification Search .............. 438/706, 438/735, 736, 737, 745, 750; 216/41, 46, 216/47, 103; 430/312, 313
See application file for complete search history.

(56) References Cited

U.S. PATENT DOCUMENTS

| 6,916,594 | B2 | 7/2005 | Bok et al. | |
|---|---|---|---|---|
| 2004/0185382 | A1* | 9/2004 | Byun et al. | 430/313 |
| 2006/0046205 | A1* | 3/2006 | Hah et al. | 430/324 |
| 2006/0105574 | A1* | 5/2006 | Regini et al. | 438/706 |
| 2007/0048670 | A1* | 3/2007 | Choi et al. | 430/311 |

FOREIGN PATENT DOCUMENTS

| JP | 2004-212967 | 7/2004 |
|---|---|---|
| JP | 2008-298862 | 12/2008 |
| KR | 1020040060707 A | 7/2004 |
| KR | 1020060045265 A | 5/2006 |

* cited by examiner

*Primary Examiner* — Lan Vinh

(74) *Attorney, Agent, or Firm* — Myers Bigel Sibley & Sajovec, P.A.

(57) ABSTRACT

A method of forming fine patterns of a semiconductor device is provided. The method includes forming plural preliminary first mask patterns, which are spaced apart from each other by a first distance in a direction parallel to a surface of a substrate, on the substrate; forming an acid solution layer on the substrate to cover the plural preliminary first mask patterns; forming plural first mask patterns which are spaced apart from each other by a second distance larger than the first distance, of which upper and side portions are surrounded by acid diffusion regions having first solubility; exposing the first acid diffusion regions by removing the acid solution layer; forming a second mask layer having second solubility lower than the first solubility in spaces between the acid diffusion regions; and forming plural second mask patterns located between the plural first mask patterns, respectively, by removing the acid diffusion regions by the dissolvent.

20 Claims, 12 Drawing Sheets

METHODS OF FORMING FINE PATTERNS OF SEMICONDUCTOR DEVICE

CROSS-REFERENCE TO RELATED APPLICATIONS

This U.S. non-provisional patent application claims priority under 35 U.S.C. §119 of Korean Patent Application 10-2009-0068978, filed on Jul. 28, 2009, the entire contents of which are hereby incorporated by reference.

BACKGROUND

The present disclosure herein relates to methods of fabricating semiconductor devices, and more particularly, to methods of forming fine patterns of a semiconductor device to form the fine patterns with a fine pitch exceeding the resolution limit of a known exposure equipment by using a double patterning process.

In order to manufacture a higher integrated semiconductor device, it is necessary to make a pattern fine. The size of each device has to be formed as small as possible to integrate more devices in a certain area. In order to achieve the higher integration, it is necessary to miniaturize a pitch which is the sum of the width of each pattern and the distance between the patterns. With a rapid decrease in the design rule of a semiconductor device, there is a limit to forming a pattern with a fine pitch due to the resolution limit to a photolithography process of forming a pattern necessary to realize a semiconductor device. In particular, there is a limit to forming a desired pattern with a fine pitch due to the resolution limit to a photolithography process of forming a line and space pattern on a substrate.

In order to solve the resolution limit to the photolithography process, there was suggested a method of forming a fine hard mask pattern with a fine pitch in a double patterning process. In the method of forming a fine pattern in the double patterning process, however, there are disadvantages in terms of a complicated process and a processing cost, since a deposition process and an etching process are performed in an opening with a large aspect ratio and a narrow width. Moreover, it is difficult to form a film having no defect such as a void inside the opening, since a material for forming a fine mask pattern has to be deposited in the opening with the large aspect ratio and the narrow width.

SUMMARY

The present disclosure provides a method of forming fine patterns on a semiconductor device that can increase double the density of pattern in a certain region using a chemical reaction while avoiding expensive deposition equipments when etching mask patterns are formed by a double patterning process.

Embodiments of the inventive concept provide a method of forming fine patterns on a semiconductor device, including: forming plural preliminary mask patterns on a substrate; forming an acid solution layer on the substrate to cover the plural preliminary mask patterns; diffusing acid obtained from an acid source in the acid solution layer into the plural preliminary mask patterns to convert upper and side portions of the plural preliminary mask patterns into first acid diffusion regions having a first solubility in a dissolvent; removing the acid solution layer to expose the first acid diffusion regions; forming a mask layer having a second solubility lower than the first solubility in spaces between the first acid diffusion regions; and removing the first acid diffusion regions by the dissolvent to form plural mask patterns.

In some embodiments, the removing the acid solution layer may be performed using deionized water.

In other embodiments, the converting the upper and side portions of the plural preliminary mask patterns into the first acid diffusion regions may include thermally-treating or exposing a resultant product in which the acid solution layer is formed.

In still other embodiments, the dissolvent may include an aqueous alkaline solution.

In even other embodiments, the method may further include: after exposing the first acid diffusion regions, forming capping layers having a third solubility higher than the second solubility and including an acid source on upper and side portions of the first acid diffusion regions; and diffusing acid obtained from the acid source in the capping layer into the mask layer to convert parts of the mask layer adjacent to the capping layers into second acid diffusion regions.

In yet other embodiments, the capping layer may include a water-soluble polymer and the acid source, and the acid source may include at least one selected from water-soluble acid and potential acid.

In further embodiments, the forming the capping layers on upper and side portions of the first acid diffusion regions may include attaching the capping layers to exposed surfaces of the first acid diffusion regions by an ion bonding between hydrogen atoms present in the exposed surfaces of the first acid diffusion regions and the water-soluble polymer contained in the capping layers.

In still further embodiments, the converting the parts of the mask layer adjacent to the capping layers into the second acid diffusion regions may include thermally-treating or exposing a resultant product in which the mask layer is formed.

In even further embodiments, the method may further include: removing the second acid diffusion regions and the capping layers by the dissolvent.

In yet further embodiments, the method may include: etching the substrate by an etching process that uses the plural mask patterns as an etching mask.

DETAILED DESCRIPTION OF THE EMBODIMENTS

Figure 1A:
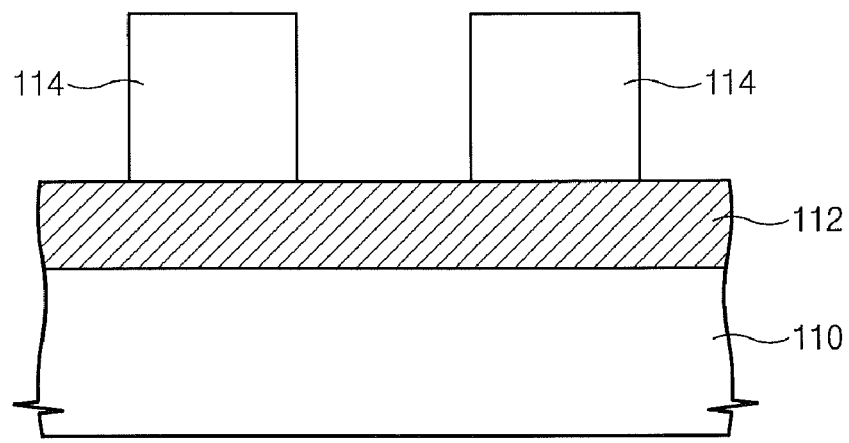
FIGS. 1A through 1H are sectional views illustrating a method of forming a fine pattern of a semiconductor device according to an embodiment of the inventive concept.

Hereinafter, preferred embodiments of the inventive concept will be described in detail in conjunction with the accompanying drawings. Advantages and features of the present invention and methods of accomplishing the same may be understood more readily by reference to the following detailed description of preferred embodiments and the accompanying drawings. The exemplary embodiments of the inventive concept may, however, be embodied in many different forms and should not be construed as being limited to the embodiments set forth herein. Rather, these embodiments are provided so that this disclosure will be thorough and complete and will fully convey the scope of the inventive concept to those skilled in the art, and the embodiments of the inventive concept will only be defined by the appended claims. Like reference numerals refer to like elements throughout the specification.

The terminology used herein is for the purpose of describing various embodiments only and is not intended to be limiting of example embodiments. As used herein, the singular forms are intended to include the plural forms as well, unless the context clearly indicates otherwise. It will be further understood that the terms "comprises" and/or "comprising," when used in this specification, specify the presence, of stated elements, steps, operations, and/or components, but do not preclude the presence or addition of one or more other elements, steps, operations, components, and/or groups thereof.

Exemplary embodiments are described herein with reference to cross-sectional illustrations and/or plane illustrations that are schematic illustrations of idealized embodiments of example embodiments. In drawings, the thickness of layers and regions is exaggerated to effectively describe technical details. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIGS. 1A through 1H are sectional views illustrating a method of forming a fine pattern of a semiconductor device according to an embodiment of the inventive concept.

Referring to FIG. 1A, an etching layer 112 is formed on a substrate 110. The substrate 110 may be, for example, a silicon substrate.

Plural preliminary first mask patterns 114 are formed on the etching layer 112. The plural preliminary first mask patterns 114 may be formed so as to be spaced apart from each other by a first distance in a direction parallel to a surface of the substrate 110.

The plural preliminary first mask patterns 114 may be formed so as to have a pitch larger than the pitch of a fine pattern, which is intended to be finally formed on the etching layer 112. The plural preliminary first mask patterns 114 may be formed so as to have a width larger than the width of the fine pattern which is intended to be finally formed on the etching layer 112.

The etching layer 112 may be formed of various materials depending on the use of a pattern to be formed. When gate electrodes are formed on the substrate 110, the etching layer 112 may be a conductive layer including a doped polysilicon layer or a stacked structure consists of a doped polysilicon layer and a metal silicide layer. When a bitline is formed on the substrate 110, the etching layer 112 may be a metal conductive layer formed of, for example, tungsten (W) or aluminum (Al). Alternatively, the etching layer 112 may be an insulating layer which is used as a mold layer in a damascene wiring process. When a fine pattern is finally formed on the substrate 110 by etching the substrate 110, the etching layer 112 may be omitted. For example, when a fine pattern forming method according to an embodiment of the inventive concept is used to define an active region in the substrate 110, the etching layer 112 may be omitted. Before the preliminary first mask patterns 114 may be formed, an anti-reflective layer (not illustrated) formed of an organic material, an inorganic material, or a combination thereof may further be formed on the etching layer 112, as necessary.

The preliminary first mask patterns 114 may be formed of an organic material. For example, the preliminary first mask patterns 114 may be formed of resist patterns obtained from a general resist composition. In order to form the preliminary first mask patterns 114, for example, a resist layer is formed by applying a photoresist material on the etching layer 112, and then the resist patterns may be formed so as to have openings exposing the upper surface of the etching layer 112 by a predetermined width by exposing and developing the resist layer in accordance with a general photolithography process.

Figure 1B:
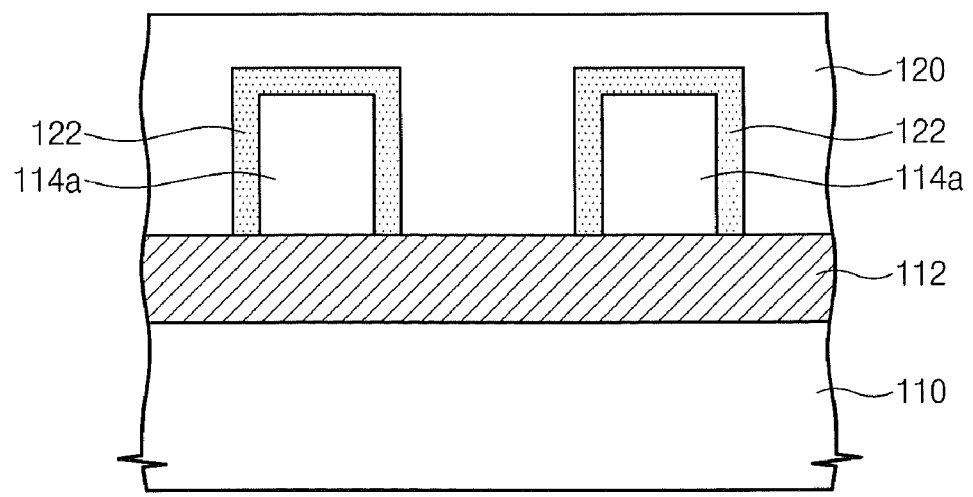

Referring to FIG. 1B, an acid solution layer 120 is formed on the substrate 110 so as to cover the plural preliminary first mask patterns 114.

The acid solution layer 120 may include at least one acid source selected from a general acid and a potential acid. The potential acid may be a thermal acid generator (TAG) or a photo acid generator (PAG). The acid solution layer 120 may be dissolved in water.

An acid obtained from the acid source contained in the acid solution layer 120 is diffused into the plural preliminary first mask patterns 114, so that upper and side portions of the plural preliminary first mask patterns 114 are converted into acid diffusion regions 122. Accordingly, plural first mask patterns 114a may be formed which are spaced apart from each other by a second distance larger than the first distance, of which upper and side portions are surrounded by the acid diffusion regions 122. As a consequence, the first mask patterns 114a may have a width narrower than the width of the preliminary first mask patterns 114. The acid diffusion regions 122 may be used as space parts ensuring spaces between the first mask patterns 114a and preliminary second mask patterns 130a (see FIG. 1E) which are formed in the subsequent process. Exposed surfaces of the first mask patterns 114a may have a satisfactory profile, since the acid diffusion regions 122 are formed using the acid solution layer 120.

The upper and side portions of the plural preliminary first mask patterns 114 may be converted into the acid diffusion regions 122 by a thermal treatment or exposing process.

When the thermal treatment is used to convert the upper and side portions of the plural preliminary first mask patterns 114 into the acid diffusion regions 122, the acid source contained in the acid solution layer 120 may include at least one of the general acid and the thermal acid generator.

When the thermal treatment is used to convert the upper and side portions of the plural preliminary first mask patterns 114 into the acid diffusion regions 122, a process may include heating a resultant product obtained by forming the acid solution layer 120 on the substrate 110 in order to convert the upper and side portions of the plural preliminary first mask patterns 114 into the acid diffusion regions 122 and of generating an acid from the thermal acid generator present in the acid solution layer 120. In this case, moreover, a process may continuously be performed in a way of diffusing the acid generated from the general acid and/or the thermal acid generator present in the acid solution layer 120 into the plural preliminary first mask patterns 114. Here, the thermal treatment may be performed, for example, at a temperature from about 25 to 200° C. to generate and diffuse the acid. The period of the thermal treatment may be controlled variably in accordance with a desired acid diffusion distance.

When the exposing process is used to convert the upper and side portions of the plural preliminary first mask patterns 114 into the acid diffusion regions 122, the acid source contained in the acid solution layer 120 may include the photo acid generator.

During the exposing process, the upper and side portions of the plural preliminary first mask patterns 114 are converted into the acid diffusion regions 122 by exposing a resultant product obtained by forming the acid solution layer 120 on the substrate 110 to one beam selected from a KrF eximer laser beam (248 nm), an ArF eximer laser beam (193 nm), and a $F_2$ eximer laser beam (157 nm) to generate an acid from the photo acid generator in the acid solution layer 120 and then diffusing the acid present in the acid solution layer 120 generated from the photo acid generator by the thermal treatment into the plural preliminary first mask patterns 114. Here, the thermal treatment may be performed, for example, at a temperature from about 25 to 200° C. to diffuse the acid. The period of the thermal treatment may be controlled variably in accordance with a desired acid diffusion distance.

Figure 1C:
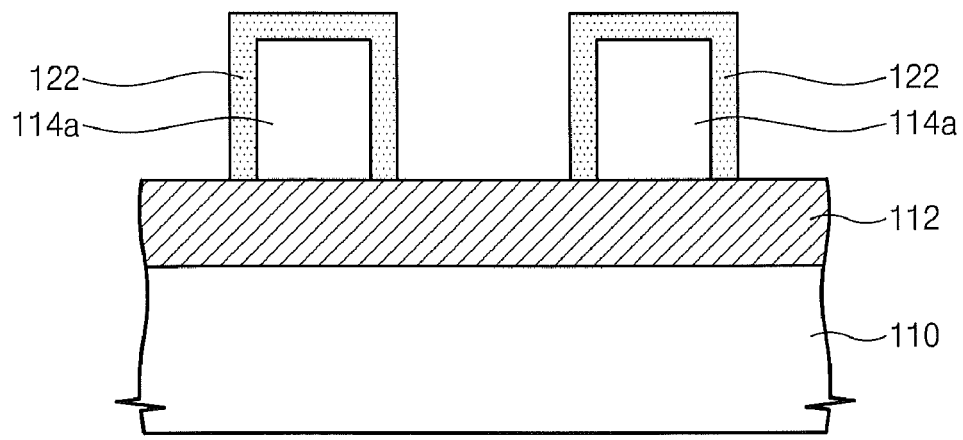

Referring to FIG. 1C, the acid solution layer 120 is removed. Deionized water (DI water) may be used to remove the acid solution layer 120. This is because the acid solution layer 120 may be dissolved in water.

The plural first mask patterns 114a may be hardened so that the plural first mask patterns 114a have an insoluble property in an organic solvent such as propylene glycol methyl ether acetate (PGMEA), ethyl lactate (EL), or cyclohexanone.

In order to harden the plural first mask patterns 114a, a plasma process may be performed on the plural first mask patterns 114a. Argon plasma or hydrobromide (HBr) plasma may be used in the plasma process.

Here, the plasma process is performed after the acid diffusion regions 122 are formed, but is not limited thereto. For example, the plasma process may be performed before the formation of the acid diffusion regions 122 after the plural preliminary first mask patterns 114.

Figure 1D:
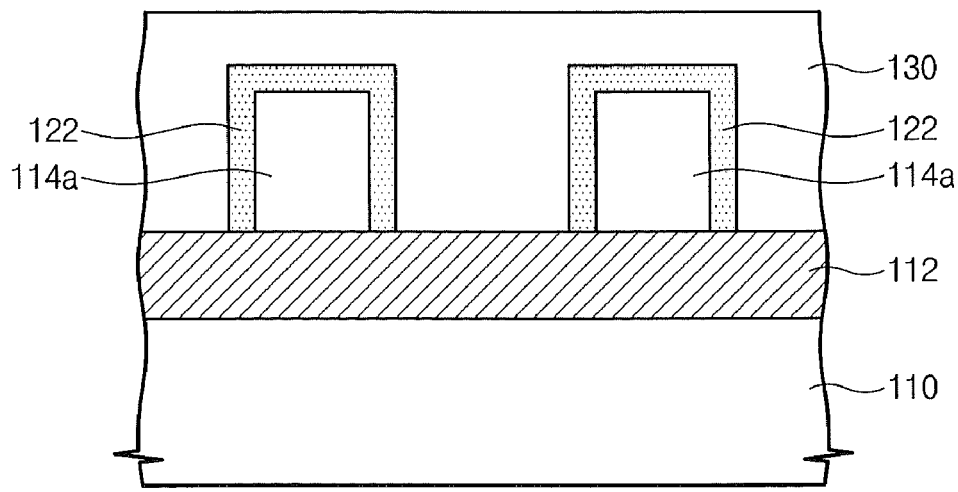

Referring to FIG. 1D, a second mask layer 130 is formed in the spaces between the acid diffusion regions 122.

The second mask layer 130 may be formed of a resist composition. Here, the resist composition forming the second mask layer 130 may be a chemically amplified resist (CAR) composition of a positive type or a negative type. For example, the second mask layer 130 may be obtained from a resist composition for a KrF eximer laser beam (248 nm), a resist composition for an ArF eximer laser beam (193 nm), or a resist composition for an extreme ultraviolet (EUV) beam (13.5 nm). Since processing performed by use of exposing and an acid is not performed on the second mask layer 130 in the subsequent process, a material containing no potential acid such as a thermal acid generator or a photo acid generator may be used as the resist composition forming the second mask layer 130. Alternatively, when the second mask layer 130 includes the potential acid such as the photo acid generator, the exposing process may further be performed on second mask patterns 130b (see FIG. 1G).

The second mask layer 130 may be formed of a material of which solubility in a dissolvent, for example, an aqueous alkaline solution such as a standard 2.38 wt % aqueous tetramethylammonium hydroxide (hereinafter, referred to as TMAH) solution is lower than that of the acid diffusion regions 122. For example, the second mask layer 130 may be formed of a material of which solubility in the aqueous alkaline solution is about 1 to 10 Å/sec. The second mask layer 130 may be formed of a resist material having a dark erosion characteristic in which a resist film not exposed is dissolved or developed by a developer to form the second mask layer 130. By forming the second mask layer 130 with a resist material of which a dark erosion characteristic is relatively low, the solubility of the second mask layer 130 in a developer may be smaller than that of the acid diffusion region 122. Since the acid in the acid diffusion region 122 well reacts to alkali, most of the known resist materials have a dark erosion characteristic lower than that of the acid diffusion region 122. For example, in order to form the second mask layer 130, a resist material may be used which includes a polymer with a polyhydroxy styrene (PHS) monomer unit, a polymer with an acetal-protecting group, or a polymer with a (meth)acrylate based monomer unit. The material used to form the second mask layer 130 is not particularly limited and a material with a desired dark erosion characteristic may be selected from the generally known resist materials. When the second mask layer 130 has solubility of about 1 to 10 Å/sec in the 2.38 wt % aqueous TMAH solution, the solubility of the second mask layer 130 in the developer may be sufficiently lower than the acid diffusion region 122.

The second mask layer 130 illustrated in FIG. 1D is formed such that the height of an upper surface of the second mask layer 130 from the surface of the substrate 110 is higher than the height of an upper surface of the acid diffusion regions 122, but is not limited thereto. Even though not illustrated, the height of the upper surface of the second mask layer 130 may be equal to or lower than the height of the upper surface of the acid diffusion regions 122 so that the acid diffusion regions 122 are exposed in the upper parts of the plural first mask patterns 114a after the second mask layer 130 is formed. That is, the second mask layer 130 may be formed only in the spaces between the acid diffusion regions 122. In order to form the second mask layer 130, a process of removing an organic solvent may be used, for example, by spin-coating and drying or baking the solution in which the necessary resist material is dissolved in the organic solvent.

Since the acid is contained in the acid diffusion regions 122, the acid present in the acid diffusion regions 122 may further be diffused into the second mask layer 130 during the formation of the second mask layer 130. That is, the acid present in the acid diffusion regions 122 may be diffused into the second mask layer 130 during the drying or baking processes for forming the second mask layer 130. The widths of plural preliminary second mask patterns 130a (see FIG. 1F) obtained from the second mask layer 130 in the subsequent process may be adjusted depending on an acid diffusion distance in the second mask layer 130.

Figure 1E:
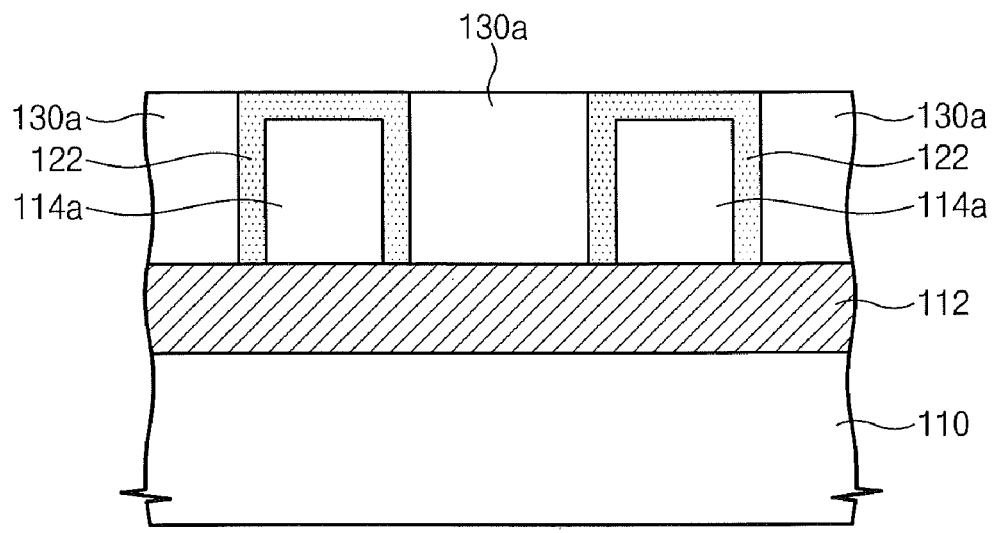

Referring to FIG. 1E, the second mask layer 130 is dissolved from the upper surface thereof with a dissolvent, until the upper surfaces of the acid diffusion regions 122 are exposed. The standard 2.38 wt % aqueous TMAH solution may be used as the dissolvent.

As the upper surfaces of the acid diffusion regions 122 are exposed, the plural preliminary second mask patterns 130a are individually formed between the plural first mask patterns 114a with the acid diffusion regions 122 interposed therebetween.

As described in FIG. 1D, the process in FIG. 1E may be omitted when the height of the upper surface of the second mask layer 130 is equal to or lower than the height of the upper surfaces of the acid diffusion regions 122.

Even though illustrated in FIG. 1D, an upper capping layer (not illustrated) or an acid supply layer (not illustrated) containing a general acid or/and a potential acid may further be formed on the upper surface of the second mask layer 130, after the second mask layer 130 is formed. In this case, the acid obtained from the upper capping layer or the acid supply layer by heating or exposing may be diffused into the entire surface of the second mask layer 130 on the surfaces of the acid diffusion regions 122. Thus, in the second mask layer 130, an upper acid diffusion region (not illustrated) extending from the upper surface of the second mask layer 130 by a predetermined depth may be formed on the entire upper surface of the second mask layer 130 as well as the upper portion of the acid diffusion regions 122. The upper acid diffusion region may have solubility in the dissolvent lower than that of the second mask layer 130.

Figure 1F:
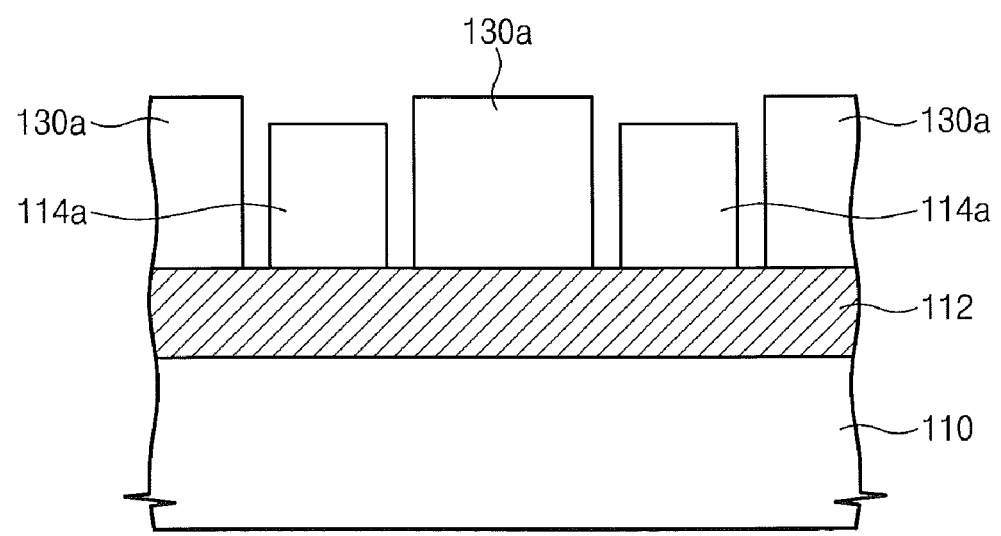

Referring to FIG. 1F, the acid diffusion regions 122 and plural preliminary second mask patterns 130a are dissolved with the dissolvent.

As a consequence, due to a difference in the solubility in the dissolvent between the acid diffusion regions 122 and the plural preliminary second mask patterns 130a, the acid diffusion regions 122 may be removed earlier than the plural preliminary second mask patterns 130a. While the acid regions 122 are removed earlier, the plural preliminary second mask patterns 130a may also be dissolved to some extent from the surfaces thereof exposed to the aqueous alkaline solution as the dissolvent.

Figure 1G:
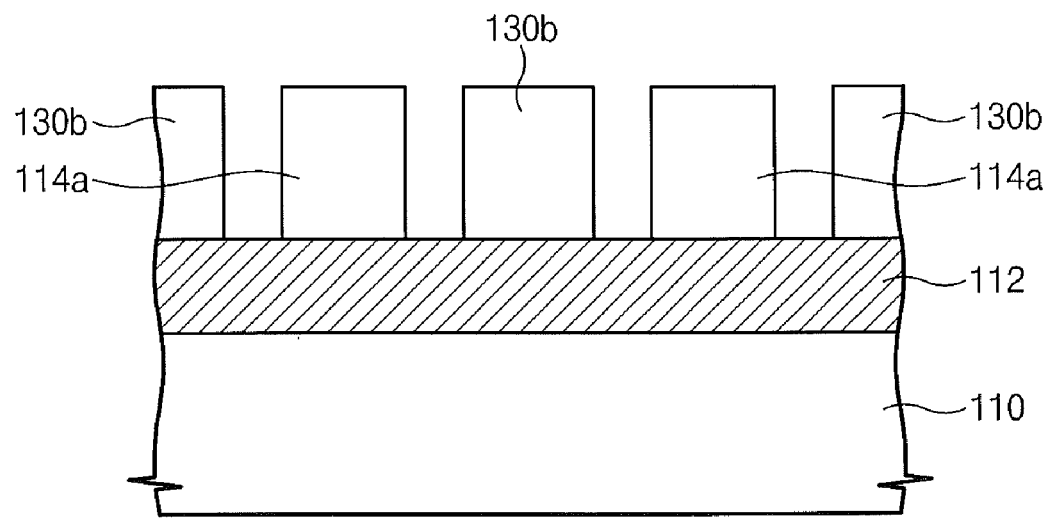

Referring to FIG. 1G, the plural second mask patterns 130b with the desired width are formed by further dissolving the plural preliminary second mask patterns 130a with the dissolvent to remove the exposed surfaces thereof.

When the widths of the plural preliminary second mask patterns 130a formed when the acid diffusion regions 122 are completely removed in the dissolving process described with reference to FIG. 1F is equal to the desired width of the plural second mask patterns 130b, the dissolving process described with reference to FIG. 1G may be omitted.

Figure 1H:
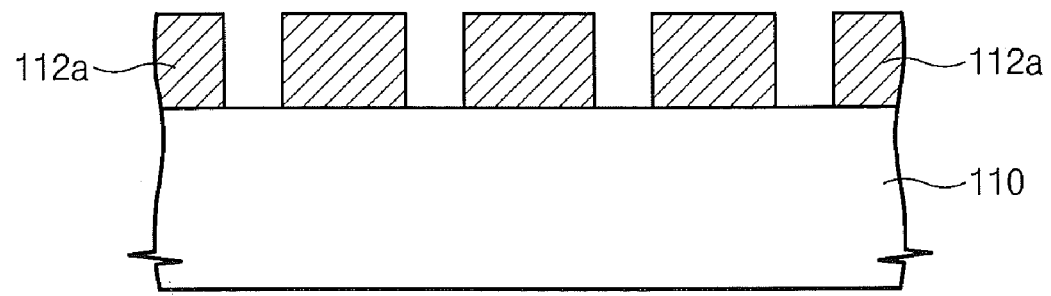

Referring to FIG. 1H, the etching layer 112 is etched to form fine patterns 112a in an etching process of using the plural first mask patterns 114a and the plural second mask patterns 130b as an etching mask.

After the plural fine patterns 112a are formed, the plural first mask patterns 114a and the plural second mask patterns 130b remaining on the plural fine patterns 112a are removed. An ashing or stripping process may be used to remove the plural first mask patterns 114a and the plural second mask patterns 130b.

When the process of forming the etching layer 112 is omitted, as described in FIG. 1A, the substrate 110 may be etched in the etching process of using the plural first mask patterns 114a and the plural second mask patterns 130b as an etching mask.

FIGS. 2A through 2I are sectional views illustrating a method of forming a fine pattern of a semiconductor device according to another embodiment of the inventive concept.

Figure 2A:
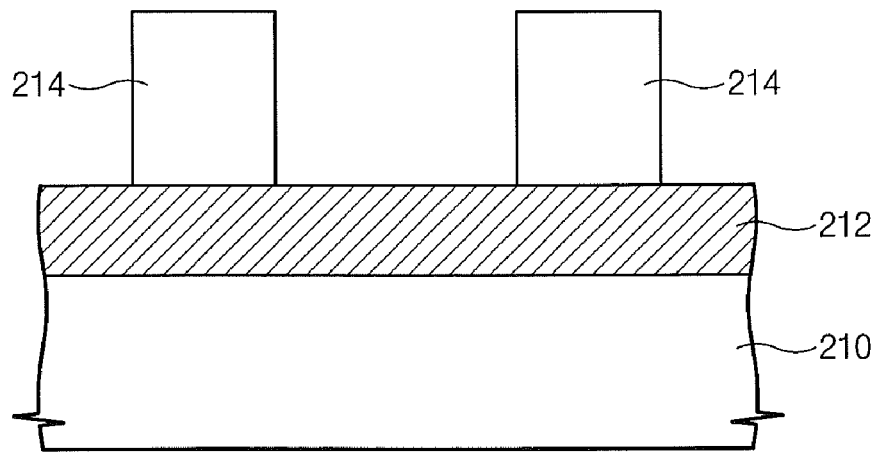
FIGS. 2A through 2I are sectional views illustrating a method of forming a fine pattern of a semiconductor device according to another embodiment of the inventive concept.

Referring to FIG. 2A, an etching layer 212 is formed on a substrate 210. The substrate 210 may be, for example, a silicon substrate.

Plural preliminary first mask patterns 214 are formed on the etching layer 212. The plural preliminary first mask patterns 214 may be formed to be spaced apart from each other by a first distance in a direction parallel to a surface of the substrate 210.

The plural preliminary first mask patterns 214 may be formed so as to have a pitch larger than the pitch of a fine pattern, which is intended to be finally formed in the etching layer 212. The plural preliminary first mask patterns 214 may be formed so as to have a width larger than the width of the fine pattern which is intended to be finally formed in the etching layer 212.

The etching layer 212 may be formed of various materials in accordance with the use of a pattern to be formed. When gate electrodes are formed on the substrate 210, the etching layer 212 may be a conductive layer including a doped polysilicon layer or a stacked structure consists of a doped polysilicon layer and a metal silicide layer. When a bitline is formed on the substrate 210, the etching layer 212 may be a metal conductive layer formed of, for example, tungsten (W) or aluminum (Al). Alternatively, the etching layer 212 may be an insulating layer which is used as a mold layer in a damascene wiring process. When a fine pattern is finally formed on the substrate 210 by etching the substrate 210, the etching layer 212 may be omitted. For example, when a fine pattern forming method according to an embodiment of the inventive concept is used to define an active region in the substrate 210, the etching layer 212 may be omitted. Before the preliminary first mask patterns 214 may be formed, an anti-reflective layer (not illustrated) formed of an organic material, an inorganic material, or a combination thereof may further be formed on the etching layer 212, as necessary.

The preliminary first mask patterns 214 may be formed of an organic material. For example, the preliminary first mask patterns 214 may be formed of resist patterns obtained from a general resist composition. In order to form the preliminary first mask patterns 214, for example, a resist layer is formed by applying a photoresist material on the etching layer 212, and then the resist patterns may be formed so as to have openings exposing the upper surface of the etching layer 212 by a predetermined width by exposing and developing the resist layer in accordance with a general photolithography process.

Figure 2B:
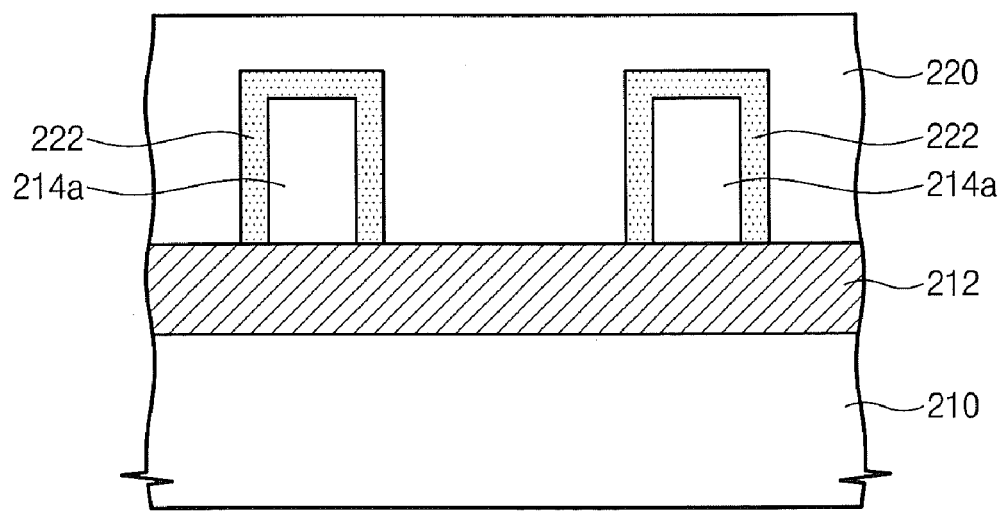

Referring to FIG. 2B, an acid solution layer 220 is formed on the substrate 210 so as to cover the plural preliminary first mask patterns 214.

The acid solution layer 220 may include at least one acid source selected from a general acid and a potential acid. The potential acid may be a thermal acid generator or a photo acid generator. The acid solution layer 220 may be dissolved in water.

An acid obtained from the acid source contained in the acid solution layer 220 is diffused into the plural preliminary first mask patterns 214, so that upper and side portions of the plural preliminary first mask patterns 214 are converted into first acid diffusion regions 222. Accordingly, plural first mask patterns 214a may be formed which are spaced apart from each other by a second distance larger than the first distance, of which upper and side portions are surrounded by the first acid diffusion regions 222. As a consequence, the first mask patterns 214a may have a width narrower than the width of the preliminary first mask patterns 214. The first acid diffusion regions 222 may be used as space parts ensuring spaces between the first mask patterns 214a and preliminary second mask patterns 230a (see FIG. 2F) which are formed in the subsequent process. Exposed surfaces of the first mask patterns 214a may have a satisfactory profile, since the first acid diffusion regions 222 are formed using the acid solution layer 220. Moreover, since the acid is evenly distributed in exposed surfaces of the first acid diffusion regions 222, capping layers 224 (see FIG. 2D) formed on the first acid diffusion regions 222 in the subsequent process may have a uniform surface.

The upper and side portions of the plural preliminary first mask patterns 214 may be converted to the first acid diffusion regions 222 by thermal treatment or an exposing process.

When the thermal treatment is used to convert the upper and side portions of the plural preliminary first mask patterns 214 into the first acid diffusion regions 222, the acid source contained in the acid solution layer 220 may include at least one of the general acid and the thermal acid generator.

When the thermal treatment is used to convert the upper and side portions of the plural preliminary first mask patterns 214 into the first acid diffusion regions 222, a process may be performed in such a way of heating a resultant product obtained by forming the acid solution layer 220 on the substrate 210 in order to convert the upper and side portions of the plural preliminary first mask patterns 214 into the first acid diffusion regions 222 and of generating an acid from the thermal acid generator present in the acid solution layer 220. In this case, moreover, a process may continuously be performed in a way of diffusing the acid generated from the general acid and/or the thermal acid generator present in the acid solution layer 220 into the plural preliminary first mask patterns 214. Here, the thermal treatment may be performed, for example, at a temperature from about 25 to 200° C. to generate and diffuse the acid. The period of the thermal treatment may be controlled variably in accordance with a desired acid diffusion distance.

When the exposing process is used to convert the upper and side portions of the plural preliminary first mask patterns 214 into the first acid diffusion regions 222, the acid source contained in the acid solution layer 220 may include the photo acid generator.

During the exposing process, the upper and side portions of the plural preliminary first mask patterns 214 are converted into the first acid diffusion regions 222 by exposing a resultant product obtained by forming the acid solution layer 220 on the substrate 210 to one beam selected from a KrF eximer laser beam (248 nm), an ArF eximer laser beam (193 nm), or a $F_2$ eximer laser beam (157 nm) to generate an acid from the photo acid generator in the acid solution layer 220 and then diffusing the acid present in the acid solution layer 220 generated from the photo acid generator by the thermal treatment into the plural preliminary first mask patterns 214. Here, the thermal treatment may be performed, for example, at a temperature from about 25 to 200° C. to diffuse the acid. The period of the thermal treatment may be controlled variably in accordance with a desired acid diffusion distance.

Figure 2C:
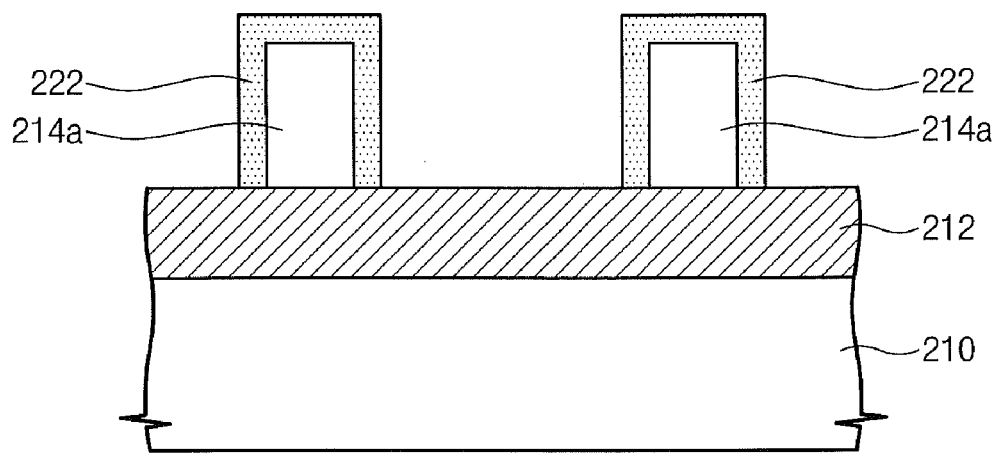

Referring to FIG. 2C, the acid solution layer 220 is removed. Deionized water may be used to remove the acid solution layer 220. This is because the acid solution layer 220 may be dissolved in water.

Figure 2D:
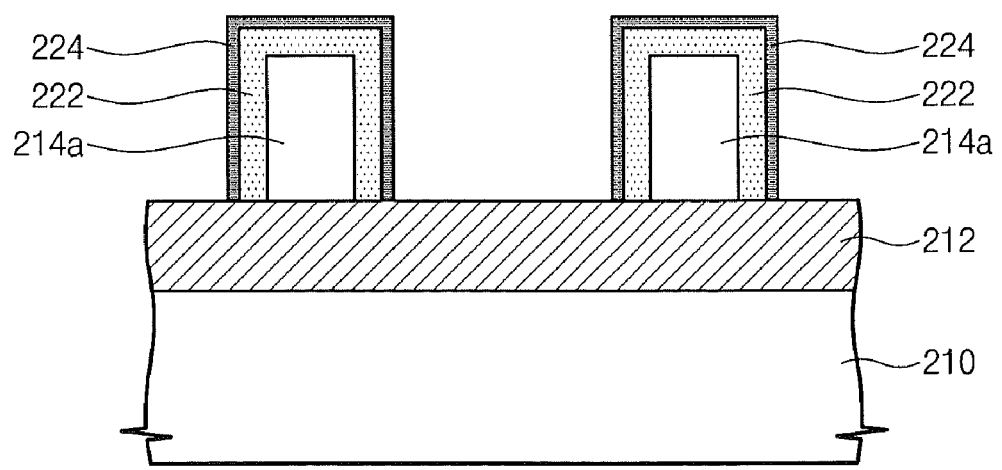

Referring to FIG. 2D, the capping layers 224 containing an acid source are formed on the upper and side portions of the first acid diffusion regions 222.

The capping layers 224 may include at least one acid source selected from a general acid and a potential acid. The potential acid may be a thermal acid generator or a photo acid generator. For example, the capping layer 224 may be formed of a mixture of a high polymer and an acid source.

The potential acid contained in the capping layer 224 may include at least one selected from $C_4F_9SO_3H$ (perfluorobutane sulfonic acid), $CF_3CO_2H$ (trifluoroacetic acid), and $CF_3SO_3H$ (trifluoromethane sulfonic acid).

Alternatively, the potential acid contained in the capping layer 224 may be, for example, a photo acid generator which includes a chromophore group and generates acid when exposed to one beam selected from a KrF eximer laser beam (248 nm), an ArF eximer laser beam (193 nm), and a $F_2$ eximer laser beam (157 nm). In this case, the photo acid generator may be formed of triarylsulfonium salts, diaryliodonium salts, sulfonates, or a mixture thereof. For example, the photo acid generator may be formed of triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate (PFOS), diphenyliodonium PFOS methoxydiphenyliodonium PFOS, di-t-butyldiphenyliodonium triflate, N-hydroxysuccinimide PFOS, norbornene-dicarboximide PFOS, or a mixture thereof.

The potential acid contained in the capping layer 224 may be a thermal acid generator generating an acid by heat, for example. The thermal acid may be formed of an aliphatic compound or an alicyclic compound. For example, the thermal acid generator may be formed of at least one compound selected from a group consisting of carbonate ester, sulfonate ester, and phosphate ester. More specifically, the thermal acid generator may be formed of at least one compound selected from a group consisting of cyclohexyl nonafluorobutanesulfonate, norbornyl nonafluorobutanesulfonate, tricyclodecanyl nonafluorobutanesulfonate, adamantly nonafluorobutanesulfonate, cyclohexyl nonafluorobutanecarbonate, norbornyl nonafluorobutanecarbonate, tricyclodecanyl nonafluorobutanecarbonate, adamantly nonafluorobutanecarbonate, cyclohexyl nonafluorobutanephosphonate, norbornyl nonafluorobutanephosphonate, tricyclodecanyl nonafluorobutanephosphonate, and adamantly nonafluorobutanephosphonate.

When the capping layer 224 is formed of a mixture of a polymer and an acid source, the acid source of 0.01 wt % to 50 wt % may be contained on the basis of the total weight of the polymer.

The polymer contained in the capping layer 224 may be formed of a water-soluble polymer. The water-soluble polymer may contain as a repetition unit at least one selected from an acrylamide type monomer unit, a vinyl type monomer unit, an alkylene glycol type monomer unit, a maleic anhydride monomer unit, an ethylene imine monomer unit, a monomer unit including an oxazoline group, an acrylonitride monomer unit, an allyl amide monomer unit, a 3,4-dihydropyran monomer unit, and a 2,3-dihydrofuran monomer unit.

As an exemplary method of forming the capping layer 224, a process may be used in such a way of coating a capping composition formed of a mixture of water, a water-soluble polymer, and an acid source formed of water-soluble acid or potential acid on the exposed surface of the first acid diffusion region 222, and then thermally treating the resultant product thereof.

As another exemplary method of forming the capping layer 224, a process may be used in such a way of mixing the RELACS™ (Resolution Enhancement Lithography Assisted by Chemical Shrink: a product of AZ Electronic Material, Corp.) material and one of the above-mentioned acid sources, spin-coating the mixture on the exposed surface of the first acid diffusion region 222, and then baking the coated mixture at a predetermined temperature during a predetermined period, for example, at about 100 to 130° C. for 20 to 70 sec to form the capping layer 224. In this case, the acid present on the surface of the first acid diffusion region 222 may serve as a catalyst and thus the RELACS™ material may be cross-linked on the surface of the first acid diffusion region 222 to form the capping layer 224. After the capping layer 224 is formed, the unnecessary coated composition remaining on the capping layer 224 is removed using one solvent selected from water, an organic solvent, a mixture of water and an organic solvent, and a developer.

The plural first mask patterns 214a may be hardened so as to have an insoluble property in an organic solvent such as propylene glycol methyl ether acetate, ethyl lactate, and cyclohexanone.

In order to harden the plural first mask patterns 214a, a plasma process may be performed on the plural first mask patterns 214a. Argon plasma or hydrobromide plasma may be used in the plasma process.

Here, the plasma process is performed after the capping layers 224 are formed, but is not limited thereto. For example, the plasma process may be performed, before the formation of the capping layers 224 after the formation of the plural preliminary first mask patterns 214 or the first acid diffusion regions 222. When the capping layers 224 contain the photo acid generator or the general acid, the solubility of the plural first mask patterns 214a in the organic solvent is changed just by the baking process for forming the capping layers 224 after the coating composition is coated on the first acid diffusion regions 222 to form the capping layers 224. Therefore, since the plural first mask patterns 214a are insoluble in the organic solvent used to coat another resist material on the capping layers 224 in the subsequent process (for example, a process of forming a second mask layer 230 described with reference to FIG. 2E), the first mask patterns 214a can be prevented from being dissolved.

Figure 2E:
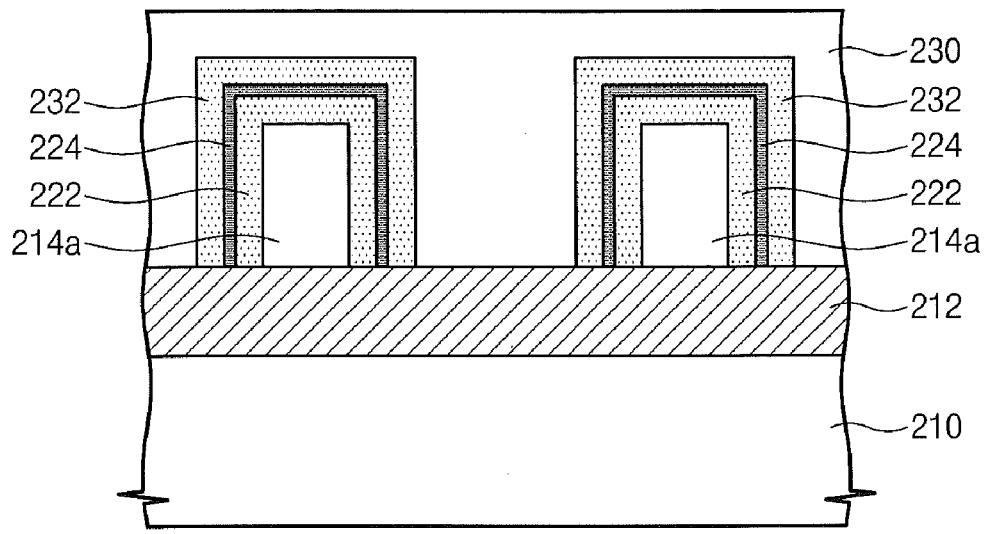

Referring to FIG. 2E, the second mask layer 230 is formed in the spaces between the capping layers 224.

The second mask layer 230 may be formed of a resist composition. Here, the resist composition forming the second mask layer 230 may be a chemically amplified resist composition of a positive type or a negative type. For example, the second mask layer 230 may be obtained from a resist composition for a KrF eximer laser beam (248 nm), a resist composition for an ArF eximer laser beam (193 nm), or a resist composition for an extreme ultraviolet beam (13.5 nm). Since processing performed by use of exposing and acid is not performed on the second mask layer 230 in the subsequent process, a material containing no potential acid such as a thermal acid generator or a photo acid generator may be used as the resist composition forming the second mask layer 230. Alternatively, when the second mask layer 230 includes the potential acid such as the photo acid generator, the exposing may further be performed on second mask patterns 230b (see FIG. 2H).

The second mask layer 230 may be formed of a material of which solubility in a dissolvent, for example, an aqueous alkaline solution such as a standard 2.38 wt % aqueous TMAH solution is lower than that of the capping layers 224. For example, the second mask layer 230 may be formed of a material of which solubility in the aqueous alkaline solution is about 1 to 10 Å/sec. The second mask layer 230 may be formed of a resist material having a dark erosion characteristic in which a resist film not exposed is dissolved or developed by a developer to form the second mask layer 230. By forming the second mask layer 230 with a resist material of which a dark erosion characteristic is relatively low, the solubility of the second mask layer 230 in a developer may be smaller than that of the capping layer 224. Most of the generally known resist materials have a dark erosion characteristic lower than that of R-607, which is a kind of the RELACS™. For example, in order to form the second mask layer 230, a resist material may be used which includes a polymer with a polyhydroxy styrene monomer unit, a polymer with an acetal-protecting group, or a polymer with a (meth)acrylate based monomer unit. The material used to form the second mask layer 230 is not particularly limited and a material with a desired dark erosion characteristic may be selected from the generally known resist materials. When the second mask layer 230 has solubility of about 1 to 10 Å/sec in the 2.38 wt % aqueous TMAH solution in the case where the capping layers 224 are formed of R-607, the solubility of the second mask layer 230 in the developer may be sufficiently lower than the capping layer 224.

The second mask layer 230 illustrated in the drawing is formed such that the height of an upper surface of the second mask layer 230 from the surface of the substrate 210 is higher than the height of an upper surface of the capping layers 224, but is not limited thereto. Even though not illustrated, the height of the upper surface of the second mask layer 230 may be equal to or lower than the height of the upper surface of the capping layers 224 so that the capping layers 224 are exposed in the upper parts of the plural first mask patterns 214a after the second mask layer 230 is formed. That is, the second mask layer 230 may be formed only in the spaces between the capping layers 224. In order to form the second mask layer 230, a process of removing an organic solvent may be used, for example, by spin-coating and drying or baking the solution in which the necessary resist material is dissolved in the organic solvent.

The acid obtained from the acid source contained in the capping layers 224 is diffused into the second mask layer 230 to convert the parts of the second mask layer 230 adjacent to the capping layers 224 into second acid diffusion regions 232. The second acid diffusion regions 232 may be used along with the first acid diffusion regions 222 and the capping layers 224 as space parts ensuring spaces between the plural first mask patterns 214a and the plural preliminary second mask patterns 230a (see FIG. 2F) formed in the subsequent process.

The parts of the second mask layer 230 adjacent to the capping layers 224 may be converted to the second acid diffusion regions 232 by a thermal treatment or an exposing process.

When the thermal treatment is used to convert the parts of the second mask layer 230 adjacent to the capping layers 224 into the second acid diffusion regions 232, the acid source contained in the capping layers 224 may include at least one of the general acid and the thermal acid generator.

When the thermal treatment is used to convert the parts of the second mask layer 230 adjacent to the capping layers 224 into the second acid diffusion regions 232, a process may be performed in such a way of heating a resultant product obtained by forming the second mask layer 230 on the substrate 210 in order to convert the parts of the second mask layer 230 adjacent to the capping layers 224 into the second acid diffusion regions 232 and of generating an acid from the thermal acid generator present in the capping layers 224. In this case, moreover, a process may continuously be performed in a way of diffusing the acid generated from the general acid and/or the thermal acid generator present in the capping layers 224 into the second mask layer 230. Here, the thermal treatment may be performed, for example, at a temperature from about 25 to 200° C. to generate and diffuse the acid. The period of the thermal treatment may be controlled variably in accordance with a desired acid diffusion distance.

When the exposing process is used to convert the parts of the second mask layer 230 adjacent to the capping layers 224 into the second acid diffusion regions 232, the acid source contained in the capping layers 224 may include the photo acid generator.

During the exposing process, the parts of the second mask layer 230 adjacent to the capping layers 224 are converted into the second acid diffusion regions 232 by exposing a resultant product obtained by forming the capping layers 224 on the substrate 210 to one beam selected from a KrF eximer laser beam (248 nm), an ArF eximer laser beam (193 nm), and a $F_2$ eximer laser beam (157 nm) to generate an acid from the photo acid generator in the capping layers 224 and then diffusing the acid present in the capping layers 224 generated from the photo acid generator by the thermal treatment into the second mask patterns 230. Here, the thermal treatment may be performed, for example, at a temperature from about 25 to 200° C. to diffuse the acid. The period of the thermal treatment may be controlled variably in accordance with a desired acid diffusion distance.

Since the general acid or the potential acid is contained in the capping layers 224, the acid generated by the general acid or the potential acid present in the capping layers 224 may further be diffused into the second mask layer 230 to some extent during the formation of the second mask layer 230. When the thermal acid generator is contained as the potential acid in the capping layers 224, the rest composition is coated to form the second mask layer 230, and then the acid generated from the thermal acid generator contained in the capping layers 224 may be diffused into the second mask layer 230 during the baking process. When the general acid is contained in the capping layers 224, the general acid present in the capping layers 224 may be diffused into the second mask layer 230 during the drying or baking process for forming the second mask layer 230. The widths of the plural preliminary second mask patterns 230a (see FIG. 2G) obtained from the second mask layer 230 in the subsequent process may be adjusted depending on the acid diffusion distance in the second mask layer 230.

Figure 2F:
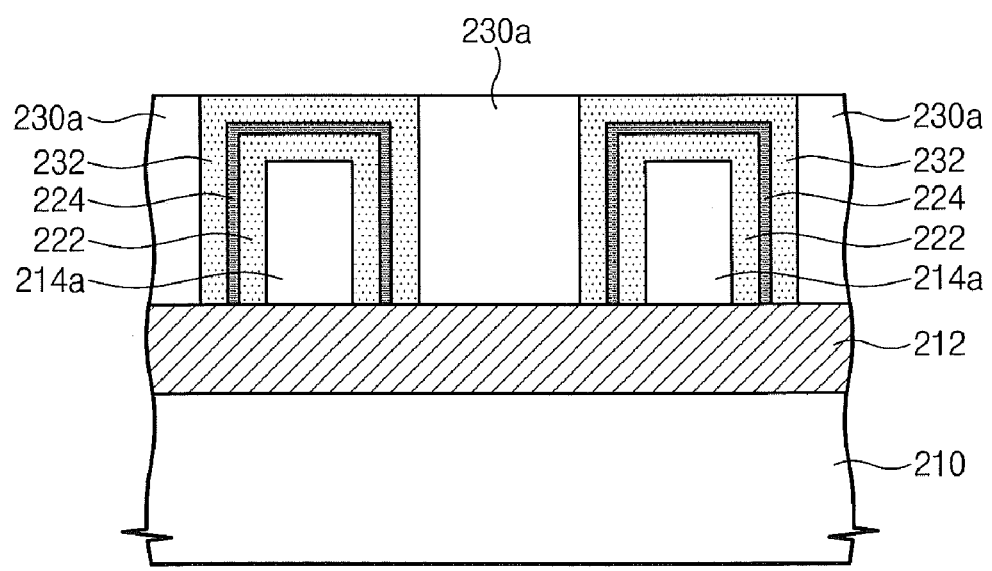

Referring to FIG. 2F, the second mask layer 230 is dissolved from the upper surface thereof with a dissolvent, until the upper surfaces of the second acid diffusion regions 232 are exposed. The standard 2.38 wt % aqueous TMAH solution may be used as the dissolvent.

As the upper surfaces of the second acid diffusion regions 232 are exposed, the plural preliminary second mask patterns 230a are individually formed between the plural first mask patterns 214a with the first acid diffusion regions 222, the capping layers 224, and the second acid diffusion regions 232 interposed therebetween.

As described in FIG. 2E, the process in FIG. 2F may be omitted when the height of the upper surface of the second mask layer 230 is equal to or lower than the height of the upper surfaces of the capping layers 224.

Even though illustrated in FIG. 2E, an acid supply layer (not illustrated) similar to the acid solution layer 220 or an upper capping layer (not illustrated) similar to the capping layer 224 may further be formed on the upper surface of the second mask layer 230, after the second mask layer 230 is formed. In this case, not only the acid obtained from the acid source contained in the second acid diffusion regions 232 and the capping layers 224 but the acid obtained from the upper capping layer or the acid supply layer may be diffused into the entire surface of the second mask layer 230 on the surfaces of the second acid diffusion regions 232. Thus, in the second mask layer 230, an upper acid diffusion region (not illustrated) extending from the upper surface of the second mask layer 230 by a predetermined depth may be formed not only on the entire upper surface of the second acid diffusion layer 232 but on the entire upper surface of the second mask layer 230. The upper acid diffusion region may have solubility lower than that of the second mask layer 230 with respect in a dissolvent.

Figure 2G:
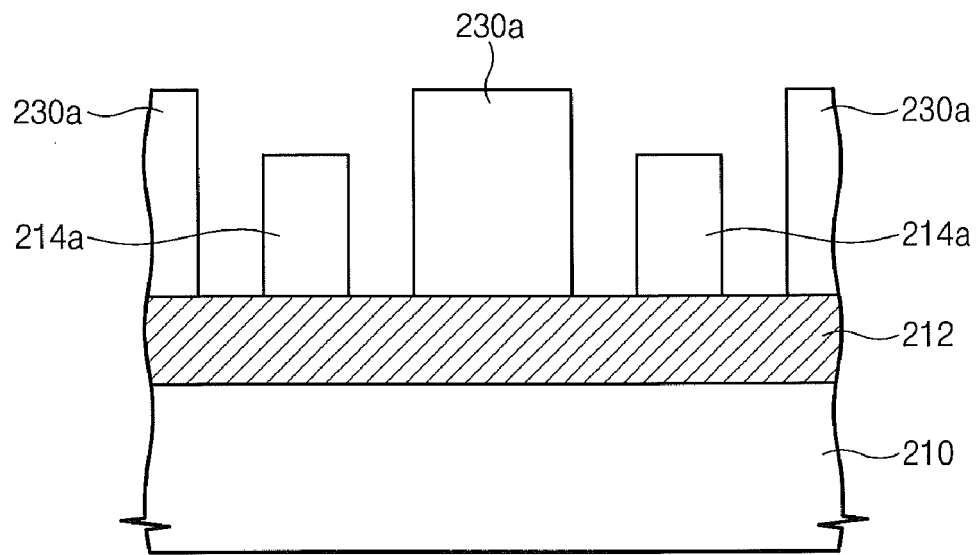

Referring to FIG. 2G, the second acid diffusion regions 232 and the plural preliminary second mask patterns 230a are dissolved with the dissolvent.

As a consequence, due to a difference in the solubility in the dissolvent between the second acid diffusion regions 232, the capping layers 224, the first acid diffusion regions 222, and the plural preliminary second mask patterns 230a, the second acid diffusion regions 232, the capping layers 224, and the first acid diffusion regions 222 may be removed earlier than the plural preliminary second mask patterns 230a. While the second acid diffusion regions 232, the capping layers 224, and the first acid diffusion regions 222 are removed earlier, the plural preliminary second mask patterns 230a may also be dissolved to some extent from the surfaces thereof exposed to the aqueous alkaline solution as the dissolvent.

Figure 2H:
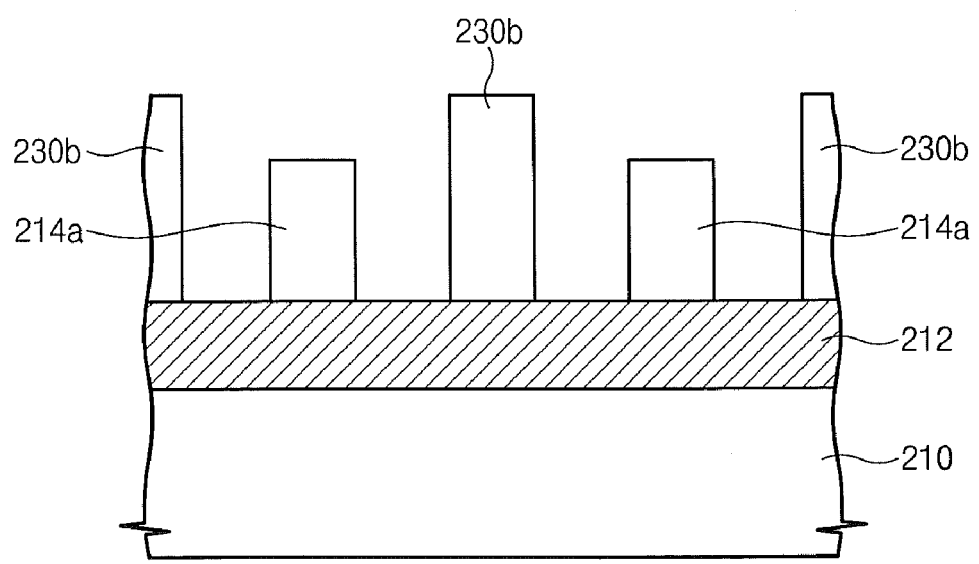

Referring to FIG. 2H, the plural second mask patterns 230b with the desired width are formed by further dissolving the plural preliminary second mask patterns 230a with the dissolvent to remove the exposed surfaces thereof.

When the widths of the plural preliminary second mask patterns 230a formed when the second acid diffusion regions 232, the capping layers 224, and the first acid diffusion regions 222 are completely removed in the dissolving process described with reference to FIG. 2G is equal to the desired width of the plural second mask patterns 230b, the dissolving process described with reference to FIG. 2H may be omitted.

Figure 2I:
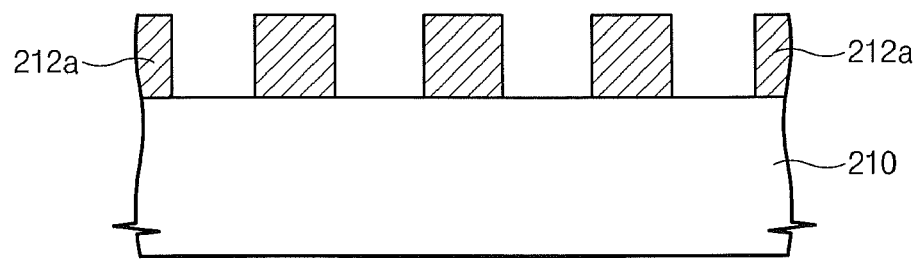

Referring to FIG. 2I, the etching layer 212 is etched to form fine patterns 212a in an etching process of using the plural first mask patterns 214a and the plural second mask patterns 230b as an etching mask.

After the plural fine patterns 212a are formed, the plural first mask patterns 214a and the plural second mask patterns 230b remaining on the plural fine patterns 212a are removed. An ashing or stripping process may be used to remove the plural first mask patterns 214a and the plural second mask patterns 230b.

When the process of forming the etching layer 212 is omitted, as described in FIG. 2A, the substrate 210 may be etched also in the etching process of using the plural first mask patterns 214a and the plural second mask patterns 230b as an etching mask.

The method of forming a fine pattern using a double patterning process according to the above-described embodiment of the inventive concept can make the first mask pattern slim by the acid diffusion using the acid solution layer. Therefore, this method may not be affected by the resolution limit to a general photolithography process. Accordingly, it is possible to provide a semiconductor device improved in the density of the patterns since the patterns have the fine pitch which is scarcely realized in the general photolithography process.

The method of forming a fine pattern using a double patterning process according to the above-described another embodiment of the inventive concept, it is possible to make the first mask pattern slim by the acid diffusion using the acid solution layer. Moreover, it is possible to make the second mask pattern slim by the acid diffusion using the capping layer. Therefore, this method may not be affected by the resolution limit to a general photolithography process. Accordingly, it is possible to provide a semiconductor device improved in the density of the patterns since the patterns have the fine pitch which is scarcely realized in the general photolithography process.

Figure 3:
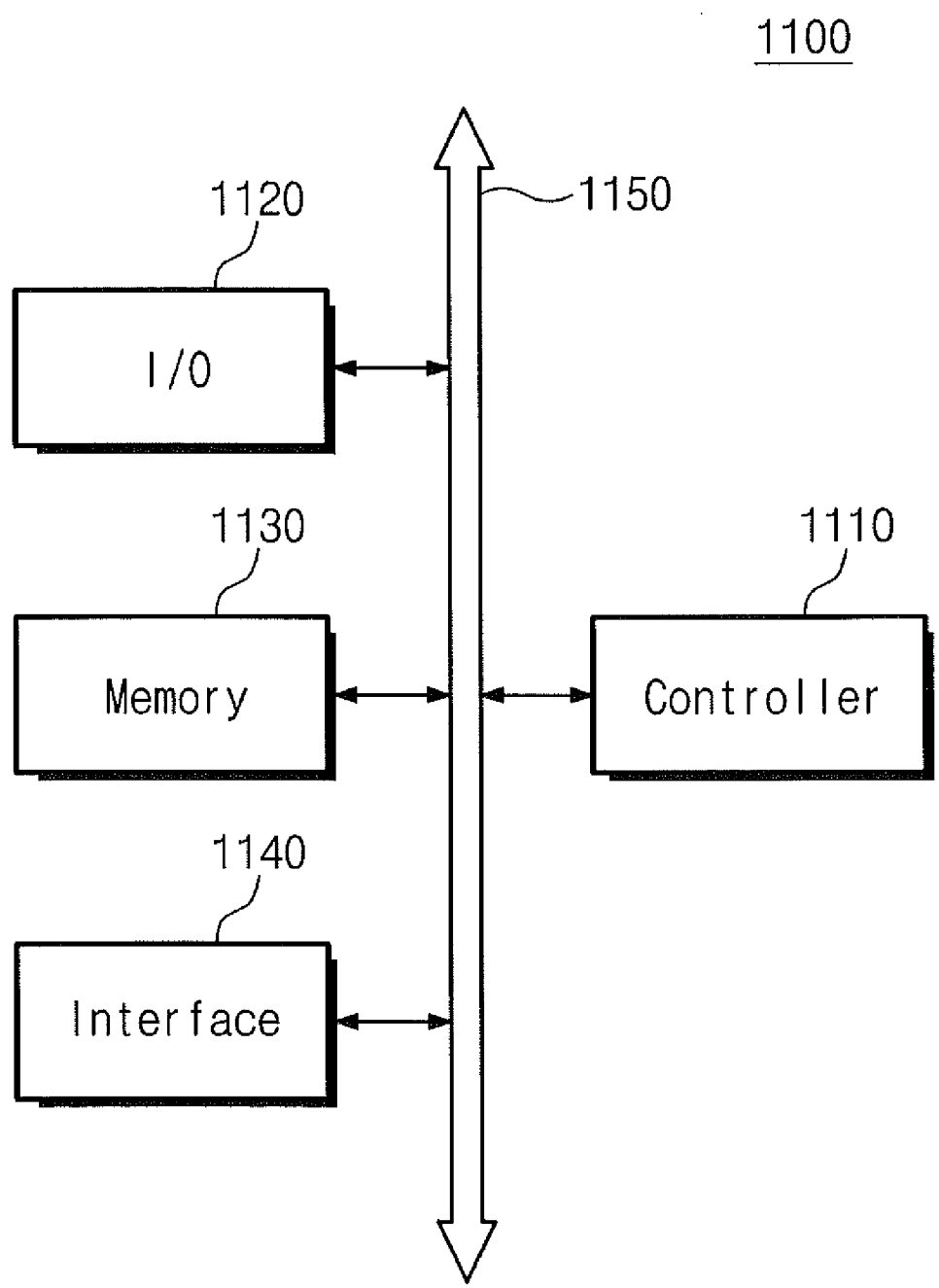
FIG. 3 is a schematic block diagram illustrating an example of a memory system including a non-volatile memory device according to embodiments of the inventive concept.

FIG. 3 is a schematic block diagram illustrating an example of a memory system including a non-volatile memory device formed by the method according to the embodiments of the inventive concept.

Referring to FIG. 3, a memory system 1100 is applicable to a personal digital assistant (PDA), a portable computer, a web tablet, a wireless phone, a mobile phone, a digital music player, a memory card, or any device capable of transmitting and/or receiving information in a wireless environment.

The memory system 1100 includes a controller 1110, an input/output (I/O) device 1120 such as a key pad, a keyboard, or a display device, a memory 1130, an interface 1140, and a bus 1150. The memory 1130 and the interface 1140 communicate with each other through the bus 1150.

The controller 1110 includes at least one microprocessor, a digital signal processor, a microcontroller, or another process unit similar thereto. The memory 1130 may be used to store commands executed by the controller 1110. The I/O device 1120 may receive data or signals from the outside of the memory system 1100 or output data or signals to the outside of the memory system 1100. For example, the I/O device 1120 may include a keyboard, a key pad, or a display device.

The memory 1130 includes the non-volatile memory device according to the embodiments of the inventive concept. The memory 1130 may further include another kind of memory, a volatile memory capable of being accessed at any time, and other various kinds of memories.

The interface 1140 transmits data to a communication network or receives data form a communication network.

Figure 4:
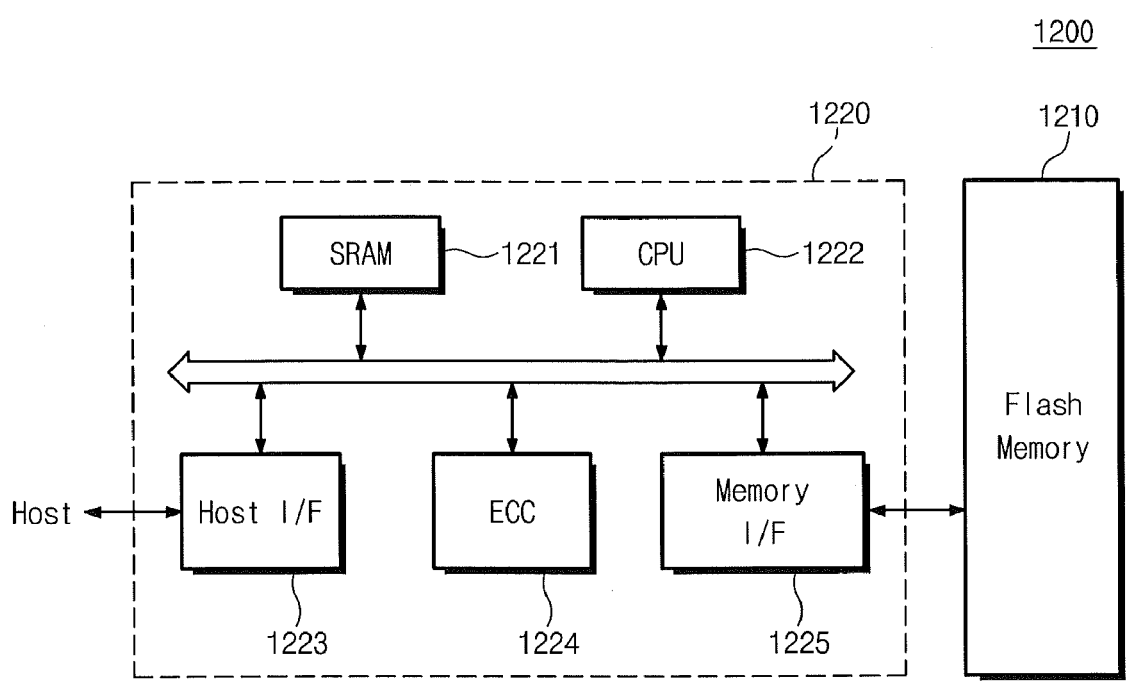
FIG. 4 is a schematic block diagram illustrating an example of a memory card including a non-volatile memory device according to embodiments of the inventive concept.

FIG. 4 is a schematic block diagram illustrating an example of a memory card including a non-volatile memory device formed by the method according to the embodiments of the inventive concept.

Referring to FIG. 4, a memory card 1200 supporting a mass data storing ability is mounted with a flash memory device 1210 formed by the method according to the inventive concept. The memory card 1200 according to the inventive concept includes a memory controller 1220 generally controlling data exchange between a host and the flash memory device 1210.

A static random access memory (SRAM) 1221 is used as a work memory, of a central processing unit (CPU) 1222 which is a processing unit. A host interface (I/F) 1223 has a data exchange protocol of a host connected to the memory card 1200. An error correction coding block (ECC block) 1224 detects and corrects an error contained in data read from the flash memory device 1210 with a multi-bit characteristic. A memory interface (I/F) 1225 interfaces the flash memory device 1210 according to the inventive concept. The central processing unit 1222 generally controls data exchange of the memory controller 1220. Even though not illustrated in the drawing, it is apparent to those skilled in the art that the memory card 1200 according to the inventive concept may further include a ROM (Read-Only Memory, which is not illustrated) storing coding data used to interface the host.

According to the flash memory device, the memory card, or the memory system according to the inventive concept, there is provided the memory system which is highly integrated as the flash memory device with higher density of the patterns. In particular, the flash memory device according to the inventive concept may be provided in a memory system such as a solid state drive (SSD), which has recently been developed. In this case, a highly integrated memory system may be realized by increasing the density of the patterns in the flash memory device.

Figure 5:
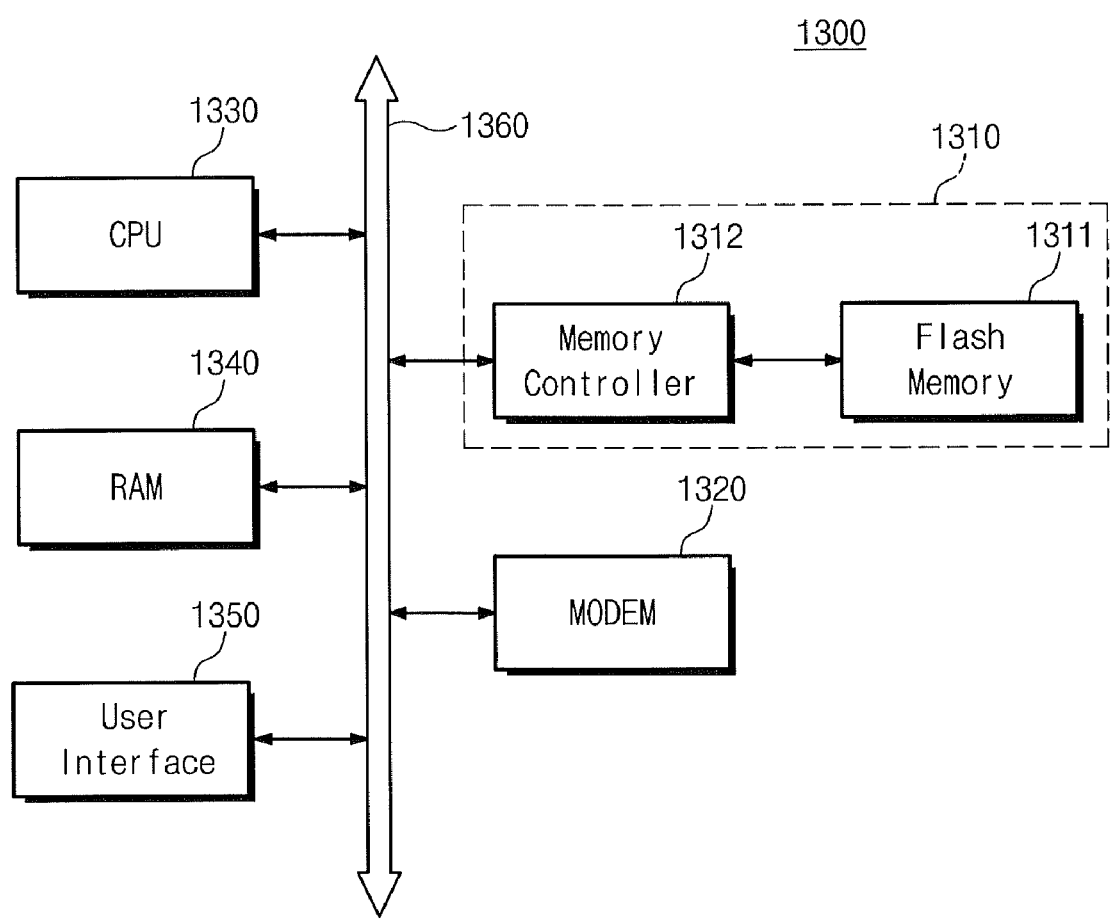
FIG. 5 is a schematic block diagram illustrating an example of an information processing system mounting a non-volatile memory device according to embodiments of the inventive concept.

FIG. 5 is a schematic block diagram illustrating an example of an information processing system mounting a non-volatile memory device formed by the method according to the embodiments of the inventive concept.

Referring to FIG. 5, a flash memory system 1310 according to the inventive concept is mounted in an information processing system such as a mobile device or a desktop computer. An information processing system 1300 according to the inventive concept includes a modulator and demodulator (MODEM) 1320, a central processing unit 1330, a RAM 1340, and a user interface 1350 electrically connected to the flash memory system 1310 via a system bus 1360. The flash memory 1310 may have substantially the same configuration as that of the memory system or the flash memory system mentioned above. The flash memory system 1310 stores data processed by the central processing unit 1330 or data input from the outside. Here, the above-described flash memory system 1310 may be formed of a solid state drive. In this case, the information processing system 1300 may stably stores mass data in the flash memory system 1310. Since the resource necessary for error correction may be saved with an increase in reliability in the flash memory system 1310, a high-speed data exchanging function may be realized to the information processing system 1300. Even though not illustrated, it is apparent to those skilled in the part that an application chipset, a camera image signal processor (ISP), an input/output device, or the like may further be included in the information processing system 1300 according to the inventive concept.

The flash memory device or the memory system according to the inventive concept may be mounted in various types of packages. For example, the flash memory device or the memory system according to the inventive concept may be packaged in a packaging way such as package on package (PoP), ball grid array (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small-outline integrated circuit (SOIC), shrink small-outline package (SSOP), thin small-outline package (TSOP), thin quad flat pack (TQFP), system in package (SIP), multi chip package (MCP), wafer-level fabricated package (WFP), or wafer-level processed stack package (WSP).

As described above, according to the embodiments of the inventive concept, since the patterns of fine pitch necessary for the fabricating the semiconductor device are formed using the acid diffusion and the differences in the solubility between materials, it is possible to easily form the patterns having the finer width that can not control by the general processes. In addition, the density of patterns may be increased. As a result, it is possible to obtain the patterns of fine pitch difficult to realize by the general photolithography process, thereby providing the semiconductor device having the patterns in which the density is increased.

Although the present invention has been described in connection with the embodiment of the present invention illustrated in the accompanying drawings, it will be apparent to those skilled in the art that various substitution, modifications and changes may be thereto without departing from the scope and spirit of the invention. Therefore, it has to be understood that the above-described embodiments are illustrative and not restrictive in all aspects.

What is claimed is:

1. A method of forming fine patterns on a semiconductor device, comprising:

forming plural preliminary mask patterns on a substrate;

forming an acid solution layer on the substrate to contact sidewalls and upper surfaces of the plural preliminary mask patterns;

diffusing acid obtained from an acid source in the acid solution layer into the sidewalls and upper surfaces of the plural preliminary mask patterns to convert upper and side portions of the plural preliminary mask patterns into first acid diffusion regions having a first solubility in a dissolvent;

removing the acid solution layer to expose the first acid diffusion regions;

forming a mask layer having a second solubility lower than the first solubility in spaces between the first acid diffusion regions; and removing the first acid diffusion regions by the dissolvent to form plural mask patterns having narrower lateral cross-sections relative to the plural preliminary mask patterns.

2. The method of claim 1, wherein the removing the acid solution layer is performed using deionized water.

3. The method of claim 1, wherein the converting the upper and side portions of the plural preliminary mask patterns into the first acid diffusion regions comprises thermally-treating or exposing a resultant product in which the acid solution layer is formed.

4. The method of claim 1, wherein the dissolvent comprises an aqueous alkaline solution.

5. The method of claim 1, further comprising etching the substrate by an etching process that uses the plural mask patterns as an etching mask.

6. The method of claim 1, further comprising: after exposing the first acid diffusion regions, forming capping layers having a third solubility higher than the second solubility and comprising an acid source on upper and side portions of the first acid diffusion regions; and diffusing acid obtained from the acid source in the capping layers into the mask layer to convert parts of the mask layer adjacent to the capping layers into second acid diffusion regions.

7. The method of claim 6, wherein the converting the parts of the mask layer adjacent to the capping layers into the second acid diffusion regions comprises thermally-treating or exposing a resultant product in which the mask layer is formed.

8. The method of claim 6, further comprising:

removing the second acid diffusion regions and the capping layers by the dissolvent.

9. The method of claim 6, wherein the capping layer comprises a water-soluble polymer and the acid source, and the acid source comprises at least one selected from water-soluble acid and potential acid.

10. The method of claim 9, wherein the forming the capping layers on the upper and side portions of the first acid diffusion regions is attaching the capping layers to exposed surfaces of the first acid diffusion regions by an ion bonding between hydrogen atoms present in the exposed surfaces of the first acid diffusion regions and the water-soluble polymer contained in the capping layers.

11. A method of forming a semiconductor device, comprising:

forming a preliminary mask comprising a plurality of preliminary mask patterns of a first material, on a substrate;

diffusing an acid into sidewalls of the plurality of preliminary mask patterns to thereby define acid diffusion regions within the plurality of preliminary mask patterns, said diffusing comprising covering the plurality of preliminary mask patterns with an acid solution layer that contacts the sidewalls of the plurality of preliminary mask patterns; and exposing the plurality of preliminary mask patterns to a solvent that selectively etches the acid diffusion regions at a faster rate relative to the first material, to thereby define a first mask comprising a plurality of first mask patterns of the first material having narrower lateral cross-sections relative to corresponding ones of the plurality of preliminary mask patterns.

12. The method of claim 11, wherein said diffusing is followed by depositing a capping layer comprising an acid source directly on the acid diffusion regions within the plurality of preliminary mask patterns.

13. The method of claim 11, wherein said diffusing further comprises: thermally treating the acid solution layer at a temperature in a range from 25° C. to 200° C.

14. The method of claim 13, wherein said thermally treating is preceded by exposing the acid solution layer to laser radiation.

15. The method of claim 11, wherein said exposing is preceded by hardening the plurality of preliminary mask patterns using an argon (Ar) or hydrobromide (HBr) plasma.

16. The method of claim 15, wherein said diffusing further comprises: thermally treating the acid solution layer at a temperature in a range from 25° C. to 200° C.

17. The method of claim 16, wherein said hardening is preceded by removing the acid solution layer from the plurality of preliminary mask patterns.

18. The method of claim 17, wherein said exposing is preceded by:

covering the plurality of preliminary mask patterns with a second mask layer; and removing portions of the second mask layer to expose the acid diffusion regions.

19. The method of claim 18, wherein said exposing comprises exposing the second mask layer and the plurality of preliminary mask patterns to the solvent, to thereby define a second mask comprising a plurality of second mask patterns comprising the same material as the second mask layer.

20. The method of claim 19, wherein the substrate comprises an etching layer thereon; and wherein said exposing is followed by selectively etching the etching layer using the plurality of first and second mask patterns as an etching mask.

* * * * *